METHOD OF MAKING SEMICONDUCTOR CIRCUIT ELEMENTS

Filed April 24, 1962 2 Sheets-Sheet 1

INVENTOR.
FREDERICK F. OHNTRUP
BY
Charles K. Lepchinsky
ATTORNEY

METHOD OF MAKING SEMICONDUCTOR CIRCUIT ELEMENTS

Filed April 24, 1962 2 Sheets-Sheet 2

*INVENTOR.*
FREDERICK F. OHNTRUP
*BY* Charles R. Lepchinsky
ATTORNEY

United States Patent Office 3,187,403

Patented June 8, 1965

3,187,403
METHOD OF MAKING SEMICONDUCTOR CIRCUIT ELEMENTS

Frederick F. Ohntrup, Plymouth Meeting, Pa., assignor to Burroughs Corporation, Detroit, Mich., a corporation of Michigan Filed Apr. 24, 1962, Ser. No. 189,759
2 Claims. (Cl. 29—25.3)

This invention relates to a method of making semiconductor circuit elements and more specifically to a simplified method of making a plurality of diffused transistors having essentially the same characteristics.

Present day circuit techniques require that a plurality of circuit elements, such as transistors, have essentially the same desirable electrical characteristics in order that waste may be reduced by eliminating costly selection and testing procedures. Economic factors require that the process of fabricating such circuit elements be economical and not complex.

Accordingly, an object of the present invention is to provide a simplified method of making semiconductor circuit elements such as transistors.

Another object of the present invention is to provide a simplified method of making a plurality of diffused transistors having the same, or substantially the same characteristics.

Another object of the present invention is to provide a novel method of making high gain transistors.

Another object of the present invention is to provide a novel method of making transistors having high power capabilities.

A further object of the present invention is to provide a novel method of making transistors having closely controlled maximum voltage capabilities.

Still anther object of the present invention is to improve transistors by a new and novel method of fabricating such circuit components.

These and other objects of the present invention are accomplished by slicing or dividing a crystal of P or N type silicon into a plurality of wafers. The entire surface of each wafer is then provided with a coating of opposite type conductivity material from which emitter and collector areas later are to be derived. The wafers are then masked and etched on one side to expose the original silicon material in selected areas which are to become base areas. The same type conductivity material as the original silicon starting material is then deposited on the exposed base areas to provide a true ohmic connection to the original silicon starting material. Each wafer is then diffused in a furnace to diffuse the emitter, base, and collector areas and to produce an accurately determined thin undiffused base area in the original silicon wafer. Each wafer is thereafter coated with a thin coating of nickel and then divided into a plurality of rectangular bar like transistors. Each rectangular bar like transistor is further divided into a plurality of individual transistors which may be connected as a group in a circuit board.

These and other features of the present invention will be more clearly and fully understood from consideration of the following detailed description when read in connection with the accompanying drawings in which like reference numerals designate like or corresponding parts throughout the several drawings and wherein.

Figure 1:
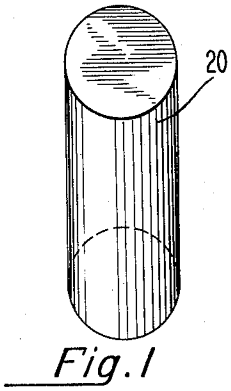
FIGURE 1 shows a semiconductor crystal illustrative of those which may be utilized in the practice of the present invention.
Figure 2:
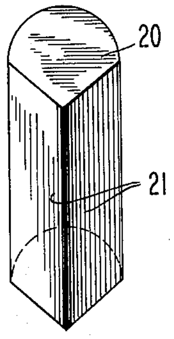
FIGURE 2 shows the semiconductor crystal of FIGURE 1 cut along its entire length to provide two straight line edges.

In accordance with the principles of the present invention a plurality of NPN transistors are fabricated by mounting, on a suitable device such as a ceramic block (not shown) a crystal of P type semiconductor silicon 20 as shown in FIGURE 1. The crystal 21 is then cut along its entire length, in a manner as shown in FIGURE 2, to form, in cross section, a disc with two straight line planes or faces 21 which may be at right angles to one another. These straight line faces are used for registration purposes as will be more fully discussed herein below.

Figure 3:
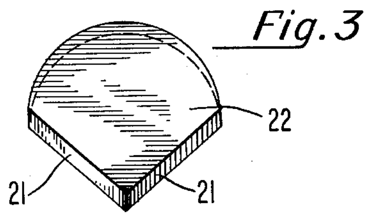
FIGURE 3 shows one of a plurality of wafers derived from the crystal of semiconductor material shown in FIGURE 2.

The cut crystal is then divided or sliced into a plurality of wafers, which may be 0.12 inch thick, by a suitable cutting device such as a diamond cutting wheel. A single wafer of P type silicon material resulting from this operation is shown in FIGURE 3 and indicated by reference character 22.

In order to remove any contaminants and/or deposits resulting from the previous slicing operation, each wafer 22 is cleaned and then pre-etched in a suitable etching solution such as a boiling solution comprising 10% by weight of potassium hydroxide in distilled deionized water. The etching time can be one minute when this etching solution is used. The wafers are then quenched in a suitable quenching material such as distilled deionized water to stop the etching action.

The thickness of each wafer 22 of P type material is then accurately reduced a predetermined amount by suitable means such as lapping each side of the wafer. For example, .002 inch may be accurately lapped from each side of each wafer 22 to produce a thickness of .008 inch with a tolerance of ±.0001 inch. To remove lap dirt, each wafer is etched for a short time in a suitable etching solution such as the boiling potassium hydroxide solution discussed above.

In order to remove any contaminants or deposits that may thereafter be on the wafers, each wafer is thoroughly cleaned by suitable cleaning methods. The wafers may be cleaned in a series of ultrasonically agitated baths such as that listed below wherein each successive bath that is identical to the previous one denotes that a clean solution is substituted for the previously used solution:

| Bath | Time, minutes | Cleaning Agent |
|---|---|---|
| 1 | 5 | Isopropanol Reagent Grade. |
| 2 | 5 | Trichlorethylene Reagent Grade. |
| 3 | 5 | Do. |
| 4 | 5 | Do. |
| 5 | 5 | Isopropanol Reagent Grade. |
| 6 | 5 | Do. |
| 7 | 5 | Distilled Deionized Water. |
| 8 | 5 | Do. |

Figure 4:
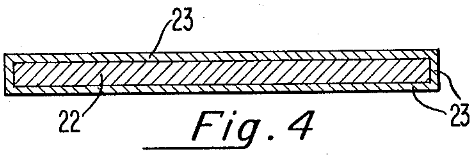

Each wafer 22 is now ready to be deposited with N type doping material that will eventually make up the emitter and collector areas. This can be accomplished by depositing phosphorous over the entire area of the wafer from a quantity of phosphorous pentoxide. Each wafer is set in the hot zone of a deposition tube (not shown) which heats the wafer to a suitable deposition temperature such as 1250 degrees centigrade. Electronic grade nitrogen can be used as a vehicle to transport the phosphorous gas, which results from the decomposition of the phosphorous pentoxide at the entrance of the deposition tube of the heated silicon wafer. Each wafer now has a coating of N type material over its entire surface. This coating is indicated by the reference character 23 in FIGURE 4 which is a cross sectional view of the wafer of P type material 22 shown in FIGURE 3 after the phosphorous has been deposited.

Each wafer 22 is now masked on one side to expose what are to become emitter areas and to cover what are to become base areas. This can be accomplished by utilizing the two straight line faces or planes of the wafers to accurately register the wafers in a silk screening apparatus. Openings in the silk screen mask correspond to the exposed emitter areas. A suitable resist material such as Apiezon wax is applied to the silk screen mask to resist the exposed areas corresponding to the emitter regions. These resisted regions are shown as the shaded substantially rectangular areas 24 in FIGURE 5 which shows the masked side of the coated wafer. The opposite side of the wafer, which is to become a collector region, is completely covered with a suitable resist material such as Apiezon wax.

Figure 5:
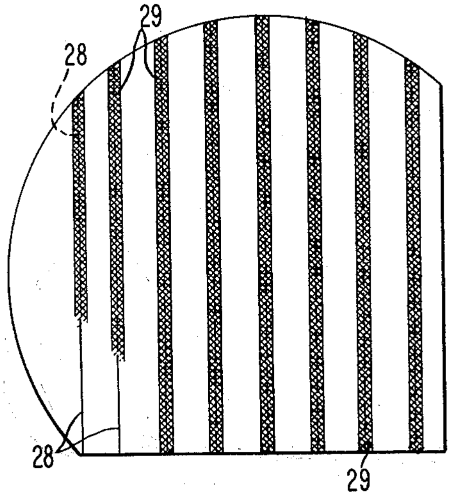

The substantially rectangular unresisted areas, shown in FIGURE 5 as the unshaded rgeions 25, which correspond to the base areas, are now etched to remove all of the N type phosphorous material which will expose the original P type starting material 22. This can be accomplished by first removing from the unresisted base areas, the glass which results from the phosphorous N type material reacting with the original P type silicon starting material during the phosphorous deposition operation, by dipping the wafer in concentrated hydrofluoric acid for a period of 30 seconds. The diffused silicon is then removed from the unresisted base areas by dipping the wafer into a suitable chemical polishing etch such as four parts hydrofluoric acid and twenty-one parts nitric acid for 1.5 minutes. The original P type starting material is now exposed at the unresisted base areas.

Figure 6:
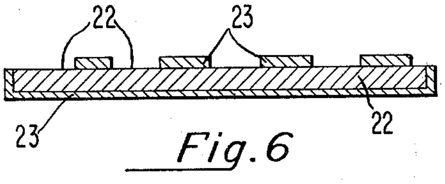

This is shown in FIGURE 6, which is a cross sectional view of the etched wafer taken along a line perpendicular to the rectangular resisted areas 24 shown in FIGURE 5, wherein the original P type wafer is indicated by the reference numeral 22. One side of the wafer, which corresponds to the collector area, is completely covered by the N type phosphorous 23. The opposite side of the wafer contains rectangular strips of the N type phosphorous 23 which are emitter areas with the original P type material 22 being exposed in the base areas between the emitter strips.

The Apiezon wax not shown is now removed from the collector and emitter areas and the wafer is thoroughly cleaned. The wafer may be cleaned in the series of ultrasonically agitated cleaning baths discussed previously.

A P type base doping material is now deposited on the exposed original starting P type material base regions, i.e. the area between the N type phosphorous emitter strips shown in FIGURE 6, to obtain a true ohmic connection to the original P type silicon base starting material. This can be accomplished by depositing boron on the exposed base areas from a quantity of boric anhydride. Each wafer is set in the hot zone of a deposition tube which heats the wafer to a suitable temperature such as 1120 degrees centigrade for a period of 30 minutes. Electronic grade introgen can be used as a vehicle to transport the boron gas, resulting from the decomposition of the boric anhydride, to the heated wafers.

After the boron P type base material is deposited on the exposed original silicon P type base material, the wafers are diffused in a diffustion furnace to drive the N type phosphorous and P type boron into the original P type silicon wafer. This diffustion process will determine the thickness of an undiffused base region in the original silicon base P type material 22. A thin undiffused base region is desirable to produce a transistor with high gain characteristics. If the thickness of the original P type wafer is known, the diffusion time then can be calculated from diffusion equations for the particular thickness of undiffused area desired. For the type of water described herein, diffustion from 16 to 20 hours at 1300 degrees centigrade produces an undiffused base thickness of .001 to .0015 inches. Since the lapping operation leaves irregularities on the surface of the P type 22 material wafer due to the size of lapping particles, the P type 22 wafers have their upper and lower surfaces polished before being coated with the P type phosphorous, when thinner undiffused base areas are required.

Figure 7:
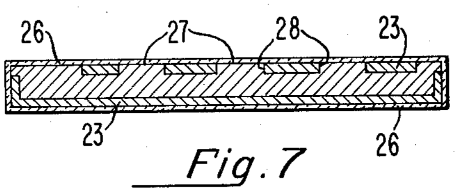
FIGURES 4, 5, 6, 7, 8, 9, 10, 11 and 12 show the wafer indicated in FIGURE 3 at various stages in the novel method comprising the subject matter of the present invention.

The diffusion operation leaves a thin coating of glass over the entire surface of the wafer which is indicated by the reference character 26 in FIGURE 7, which is a cross sectional view of the diffused wafer taken perpendicular to the rectangular emitter areas of N type material 23. Also shown in FIGURE 7 is the N type material 23 comprising the collector region, which covers the entire bottom surface of the wafer, and the rectangular strips of N type material 23 on the top surface of the wafer which comprises the emitter regions. The P type boron material which is diffused into the original base P type silicon material 22 is indicated by the reference character 27 and forms a junction 28 with the rectangular emitter strips of N type material 23. The thin undiffused base area of the original P type silicon starting material (not shown) lies intermediate and parallel to the collector and emitter base regions.

After the wafers are diffused, the junctions 28 of the N type material 23, comprising the emitter areas, with the P type boron material 27, comprising the base areas, are masked with Apiezon wax. These masked areas are indicated by the reference character 29 in FIGURE 8 which shows that a thin strip of Apiezon wax covers the junctions 28 of the base and emitter areas.

The glass 26, which covers the entire wafer due to the diffusion heating, is now removed from the wafer except in the regions masked by the Apiezon wax i.e., the junctions of the base and emitter regions. This can be accomplished by dipping the masked wafer into concentrated hydrofluoric acid for two minutes.

Figure 9:
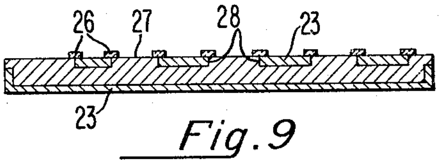

FIGURE 9, which is a cross sectional view of a wafer taken perpendicular to the rectangular emitter and base areas, shows that after the dipping in the concentrated hydrofluoric acid, all of the glass 26 is removed except at the junctions 28 of the base 27 and emitter 23 regions.

Each wafer is now cleaned and has its surface prepared for nickel plating. The surface preparation can be accomplished by etching slightly in a boiling solution, comprising 10% by weight of potassium hydroxide, for 15 seconds.

In order to obtain a good ohmic contact to the emitter, base, and collector regions and to obtain a solderable surface, each wafer is completely covered with nickel not shown, or other suitable electrical conducting metals. This may be accomplished by removing the Apiezon wax and then transferring the wafers to a boiling solution of alkaline electroless nickel plating solution where they are nickeled for approximately five minutes. The wafers are then washed in distilled deionized water.

The wafers are thereafter sintered to sinter the nickel into the emitter, base, and collector areas. The sintering may be in a sintering furnace having an atmosphere of electronic grade nitrogen at a temperature of 870 degrees centigrade for ten minutes.

Figure 8:
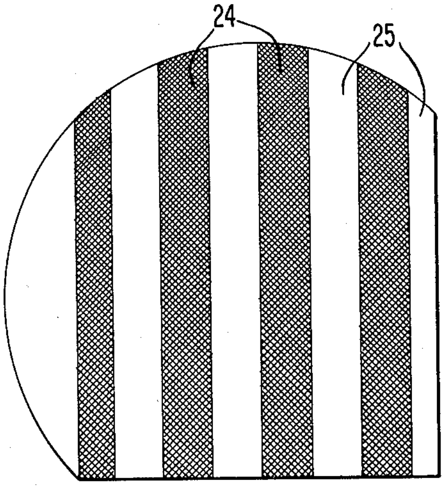

The wafers are again cleaned by resisting the emitter base junctions 28 with Apiezon wax as shown in FIGURE 8 and immersing in concentrated hydrofluoric acid for fifteen seconds. In order to brighten the surface of the nickel and make it more solderable, the Apiezon wax is now removed and the wafers are renickeled in the same electroless nickel plating solution for a suitable period of time such as fifteen minutes.

The strips of glass 26 which cover the emitter base junctions 28 prevent the nickel coating from electrically connecting the base and emitter junctions.

Figure 10:
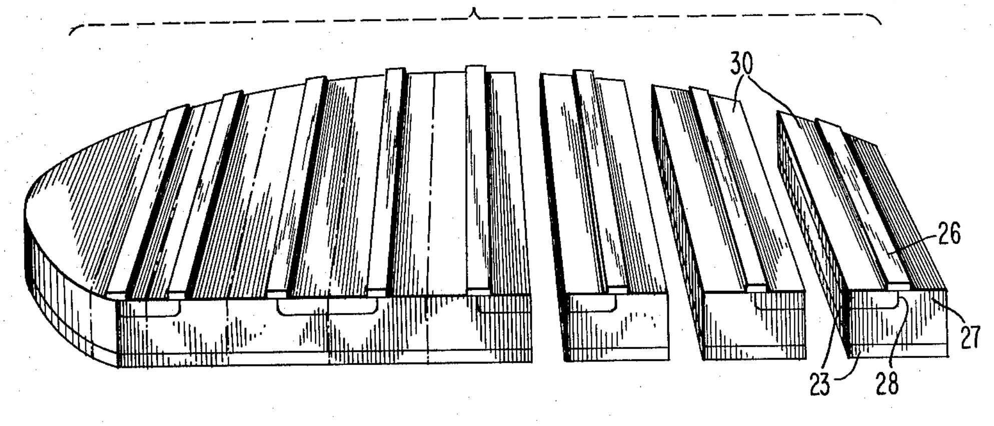

Each wafer is now divided into a plurality of rectangular bar like transistors 30, by cutting the wafer, with suitable cutting means such as an ultrasonic cutting tool, along a line intermediate and parallel to the base and emitter junctions 28 as is shown in FIGURE 10. Each rectangular bar like transistor is seen to contain, in cross section, a collector of N type material 23 along its lower surface, a thin undiffused base region (not shown) of the original starting P type silicon located above and parallel to the collector area, an emitter of N type material 23 on the upper surface of the bar transistor having a junction 28 with a base area of P type material 27 which is in electrical contact with the thin undiffused original P type base starting material (not shown) and a strip of glass 26 covering the junction 28 of the emitter-base region. It is to be understood that none of the drawings used to describe the present invention are drawn to scale but are drawn with such relative dimensions so as to clearly show and describe the present invention.

Figures 11, 12:
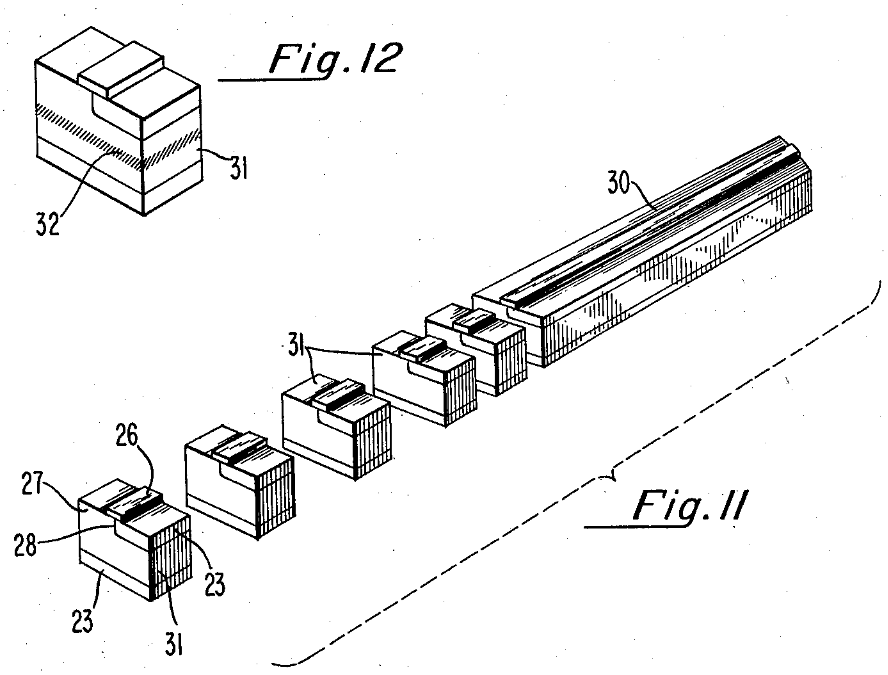

Each rectangular or bar like transistor 30 is divided into a plurality of individual transistors 31, by cutting the rectangular bar at right angles to the original cut, with suitable cutting means such as an ultrasonic cutting tool, in a manner as shown in FIGURE 11. The plurality of transistors 31 shown in FIGURE 11 may now be connected to a novel circuit board as is described in a copending application entitled "Semi-Conductor Devices and Method of Fabrication," Serial No. 189,752 filed April 24, 1962, and assigned to the same assignee as the present invention. An individual transistor 31 resulting from this process is shown in FIGURE 12 wherein the reference character 32 denotes the thin undiffused base area of P type material.

Referring again to FIGURE 11, it can be seen that each transistor produced by the method described herein has a high power handling capability because the collector area of N type material 23 is in contact with the entire base area of P type material 27. The maximum voltage capability of the transistors can be closely controlled because the maximum voltage is directly related to the resistivity of the original starting P type base material 22 shown in FIGURE 3. Also, the characteristics of each of the transistors produced are substantially the same, since they are derived from the same wafer. It should be noted here, that dividing each wafer into a plurality of individual transistors electrically isolates the base, emitter and collector areas, which were previously electrically connected together by the nickel coating that covered the entire area of the wafers.

PNP type transistors can also be fabricated by using the method described above by beginning with a crystal of N type semiconductor silicon instead of a crystal of P type material. The N type wafers, resulting from slicing the N type silicon crystal, are coated with a suitable P type material such as boron instead of N type phosphorous. When the base area is exposed, in a manner as described herein above, to show the original N type starting material, a suitable N type material, such as N type phosphorus, is deposited on the exposed base areas at a temperature of 900° centigrade for 10 minutes, instead of P type boron. Otherwise, the method for making NPN transistors, is the same as that described herein above in detail, except that before the exposed original starting N type material constituting the base areas are deposited with the N type phosphorous, it may be desirable, in order to protect the exposed original N type material so that boron cannot redeposit on it and also to drive the boron into the silicon starting material before depositing the phosphorus, that the exposed base areas be oxidized.

It will be obvious to those skilled in the art that the novel method described herein can be utilized for making PNPN or NPNP switching transistors and PNP or NPN diffused base and collector transistors without departing from the scope of the present invention.

What has been described is a simplified method of making transistors which have high gain characteristics, high power handling capabilities, close control of their maximum voltage capabilities and which are capable of being readily connectible to novel circuit boards and circuits.

It should be understood, of course, that the foregoing disclosure relates to only preferred embodiments of the present invention and that numerous modifications or alterations may be made therein without departing from the spirit and the scope of the present invention as set forth in the appended claims.

What I claim is:

1. A method of making a plurality of PNP transistors comprising:

(a) depositing P type boron material over the entire area of a wafer of N type silicon semiconductive material by heating in an atmosphere of boron gas, (b) resisting with Apiezon wax the entire area of one side of said wafer to provide a collector area thereon, (c) resisting with Apiezon wax through a screen fixture selected alternate substantially rectangular areas on the opposite side of said wafer thereby to provide emitter areas thereon and simultaneously creating unresisted alternate substantially rectangular areas between pairs of emitter areas, (d) etching the unresisted areas of the wafer to expose the original N type silicon material thereby to provide base areas, (e) oxidizing the exposed base areas, (f) depositing N type phosphorus material on the exposed base areas of said wafer by heating in an atmosphere of phosphorus gas thereby providing junctions between the base and emitter areas, (g) further heating said wafer in a high heat atmosphere to drive the N type phosphorus and P type boron by diffusion into the original N type silicon thus to form an accurately predetermined thin undiffused base area in the original N type silicon wafer, and (h) coating the entire surface of said wafer with a sintered layer of nickel thereby to provide a solderable surface and a true ohmic connection to the base, emitter and collector areas.

2. A method of making NPN transistors comprising:

(a) depositing N type phosphorus material over the entire area of a wafer of P type silicon semiconductor material by heating the P type silicon semiconductor material in an atmosphere of phosphorus gas.

(b) resisting with Apiezon wax the entire area of one side of the wafer to provide a collector area thereon, (c) resisting with Apiezon wax, selected, alternate substantially rectangular areas on the opposite side of the wafer thereby to provide emitter areas and thereby creating unresisted alternate, substantially rectangular intermediate areas, (d) etching the unresisted areas of the wafer to expose the original P type silicon material and to provide base areas thereby, (e) removing the Apiezon resist from the wafer, (f) oxidizing the base areas, (g) depositing P type boron material on the exposed base areas of each wafer by heating in an atmosphere of boron gas thereby creating junctions between the base and emitter areas, and (h) diffusing the wafer in a heated atmosphere to drive the N type phosphorus and the P type boron into the original P type silicon wafer thereby to provide an undiffused base area.

(References on following page)

References Cited by the Examiner

UNITED STATES PATENTS

| | | | |
|---|---|---|---|
| 2,441,590 | 5/48 | Ohl | 51—283 X |
| 2,804,405 | 8/57 | Derick | 148—1.5 |
| 2,814,853 | 12/57 | Paskell | 29—25.3 |
| 2,944,321 | 7/60 | Westberg | 29—25.3 |
| 2,952,896 | 9/60 | Cornelison et al. | 29—25.3 |
| 2,983,633 | 5/61 | DeBernardi | 29—25.3 |
| 3,022,568 | 2/62 | Nelson | 29—25.3 |
| 3,055,776 | 9/62 | Stevenson | 148—1.5 X |

OTHER REFERENCES

Transistor Technology (Bridgers ed.), N.Y., D. Van Nostrand, 1958, vol. I, pp. 243, 319. TK 7872 T73B45*t*.

Maissel: "Manufacture of Transistors for Microminiature Circuity," IBM Technical Disclosure Bulletin, vol. 3, No. 12, May 1961.

"Ultrasonic Cleaning of Transistors," SCTM 136-61 (14) by Sandia Corp.

RICHARD H. EANES, Jr., *Primary Examiner.*